(12) United States Patent
Tai et al.

(10) Patent No.: US 12,045,100 B2
(45) Date of Patent: *Jul. 23, 2024

(54) ELECTRONIC DEVICE

(71) Applicant: Innolux Corporation, Miao-Li County (TW)

(72) Inventors: Ming-Jou Tai, Miao-Li County (TW); Chia-Hao Tsai, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/165,341

(22) Filed: Feb. 7, 2023

(65) Prior Publication Data

US 2023/0176632 A1 Jun. 8, 2023

Related U.S. Application Data

(63) Continuation of application No. 17/072,052, filed on Oct. 16, 2020, now Pat. No. 11,604,497.

(60) Provisional application No. 62/929,954, filed on Nov. 4, 2019.

(30) Foreign Application Priority Data

Sep. 4, 2020 (CN) .......................... 202010922405.6

(51) Int. Cl.
*G09G 5/00* (2006.01)
*G06F 1/18* (2006.01)
*H01L 27/12* (2006.01)

(52) U.S. Cl.
CPC ............ *G06F 1/189* (2013.01); *H01L 27/124* (2013.01)

(58) Field of Classification Search
CPC ..... G06F 1/189; H01L 27/124; H01L 29/495; H01L 29/78633; G02F 1/133512; G02F 1/136209

See application file for complete search history.

(56) References Cited

U.S. PATENT DOCUMENTS

| 5,760,856 | A  | * | 6/1998 | Yanagawa | ......... | G02F 1/134363 |
| | | | | | | 349/110 |
| 6,765,230 | B2 | * | 7/2004 | Murade | ............. | G02F 1/136227 |
| | | | | | | 438/149 |
| 6,953,949 | B2 | * | 10/2005 | Murade | ............. | G02F 1/136209 |
| | | | | | | 257/749 |
| 7,812,352 | B2 | * | 10/2010 | Chien | ............... | G02F 1/136213 |
| | | | | | | 257/292 |
| 7,884,362 | B2 | * | 2/2011 | Jung | ..................... | G02F 1/1368 |
| | | | | | | 257/E21.411 |
| 8,159,627 | B2 | * | 4/2012 | Lin | .................... | G02F 1/136259 |
| | | | | | | 349/111 |
| 8,921,864 | B2 | * | 12/2014 | Ma | ........................ | H01L 27/124 |
| | | | | | | 257/E27.111 |
| 9,190,432 | B2 | * | 11/2015 | Sun | .................... | H01L 29/66969 |
| 9,448,447 | B2 | * | 9/2016 | Ito | ..................... | G02F 1/134363 |
| 9,620,536 | B2 | * | 4/2017 | Du | .................... | H01L 29/78675 |

(Continued)

*Primary Examiner* — Joe H Cheng
(74) *Attorney, Agent, or Firm* — JCIPRNET

(57) ABSTRACT

An electronic device includes a substrate, a data line, an insulating layer, a metal layer and a transparent conductive layer. The data line is disposed on the substrate. The insulating layer is disposed on the data line. The metal layer is disposed on the insulating layer. The transparent conductive layer is disposed on the metal layer and electrically connected to the metal layer.

14 Claims, 9 Drawing Sheets

(56) References Cited

U.S. PATENT DOCUMENTS

| | | | |
|---|---|---|---|
| 9,995,980 B2* | 6/2018 | Sun | G02F 1/136286 |
| 10,032,808 B2* | 7/2018 | Xu | G02F 1/136227 |
| 10,103,177 B2* | 10/2018 | Kim | H10K 59/38 |
| 10,649,566 B2* | 5/2020 | Yeh | G06F 3/0416 |
| 10,698,281 B2* | 6/2020 | Morinaga | G02F 1/13394 |
| 10,921,669 B2* | 2/2021 | Morinaga | G02F 1/13394 |
| 2003/0063241 A1* | 4/2003 | Matsumoto | G02F 1/133526 349/110 |
| 2010/0245735 A1* | 9/2010 | Xie | H01L 27/124 349/110 |
| 2011/0084267 A1* | 4/2011 | Yamazaki | H01L 27/124 257/43 |
| 2015/0129985 A1* | 5/2015 | Kim | H01L 27/124 257/401 |
| 2015/0378475 A1* | 12/2015 | Hayashi | G06F 3/0445 345/174 |
| 2017/0069665 A1* | 3/2017 | Ishiga | H01L 27/124 |
| 2017/0184915 A1* | 6/2017 | Yang | G02F 1/133512 |
| 2020/0033683 A1* | 1/2020 | Nomura | G02F 1/136209 |
| 2020/0135959 A1* | 4/2020 | Shibata | H01L 31/02019 |
| 2021/0043656 A1* | 2/2021 | Hara | H01L 27/1259 |

\* cited by examiner

ELECTRONIC DEVICE

CROSS-REFERENCE TO RELATED APPLICATION

This application is a continuation application of and claims the priority benefit of a prior U.S. application Ser. No. 17/072,052, filed on Oct. 16, 2020 now U.S. Pat. No. 11,604,497 B2, which claims the priority benefit of U.S. provisional application Ser. No. 62/929,954, filed on Nov. 4, 2019, and China application serial no. 202010922405.6, filed on Sep. 4, 2020. The entirety of each of the above-mentioned patent applications is hereby incorporated by reference herein and made a part of this specification.

BACKGROUND

Technical Field

The disclosure relates to an electronic device, and particularly relates to an electronic device adapted to reduce an impedance of a transparent conductive layer, mitigate a problem of visual visibility caused by metal reflection, or increase an aperture ratio.

Description of Related Art

Flat display panels have been widely used in electronic devices such as mobile phones, televisions, monitors, tablet computers, vehicle displays, wearable devices, and desktop computers. Along with booming development of electronic products, requirements on display quality of the electronic products are getting higher, so that the electronic devices used for display are continuously developed towards a trend of large size and a display effect of high resolution.

SUMMARY

The disclosure is directed to an electronic device, which is adapted to reduce an impedance of a transparent conductive layer, mitigate a problem of visual visibility caused by metal reflection, or increase an aperture ratio.

An embodiment of the disclosure provides an electronic device including a substrate, a data line, an insulating layer, a metal layer and a transparent conductive layer. The data line is disposed on the substrate. The insulating layer is disposed on the data line. The metal layer is disposed on the insulating layer. The transparent conductive layer is disposed on the metal layer and electrically connected to the metal layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
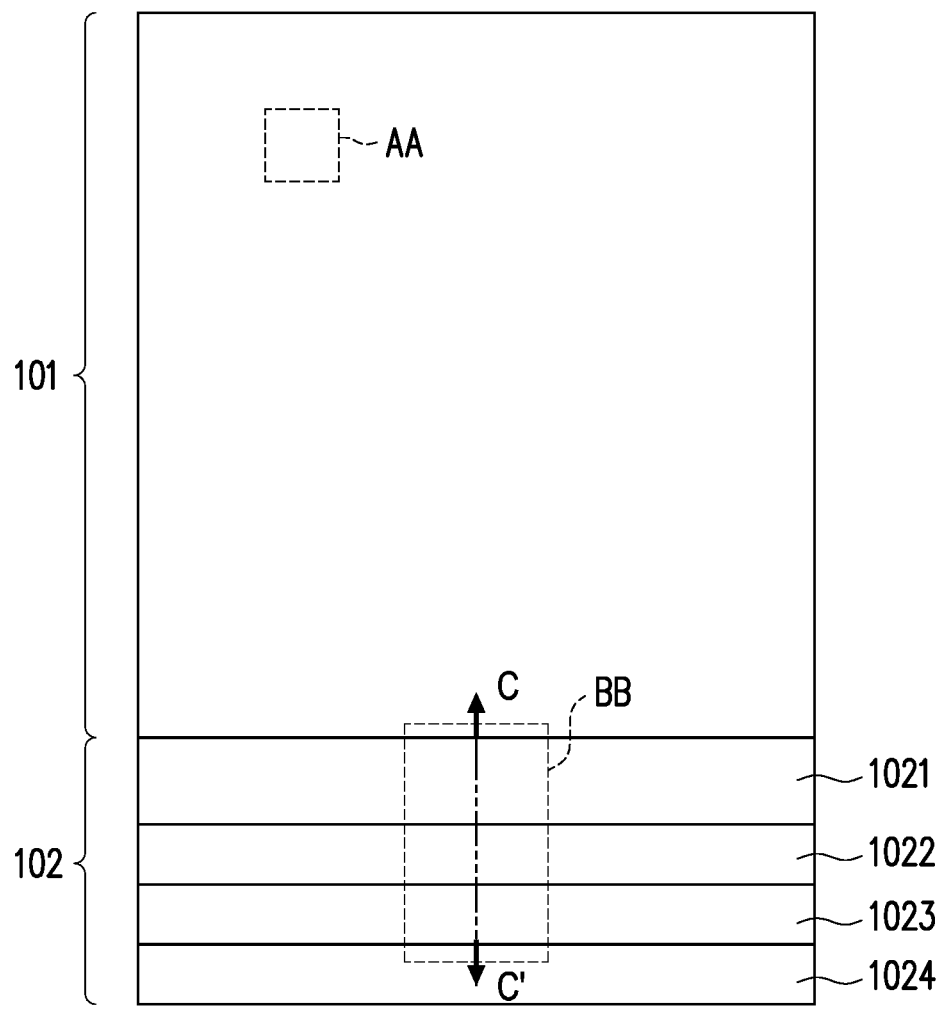
FIG. 1A is a schematic top view of an electronic device according to an embodiment of the disclosure.

The disclosure may be understood by referring to the following detailed description in collaboration with the accompanying drawings. It should be noted that, in order to facilitate user's easy understanding and simplify the drawings, only a part of an electronic device is drawn in the drawings in the disclosure, and specific elements in the drawings are not drawn according to actual scales. In addition, the number and size of each element in the drawings are only schematic, and are not used to limit a scope of the disclosure.

In the following description and claims, the words "contain" and "include" are open-ended words, so that they should be interpreted as a meaning of "containing but not limited to . . . ".

It should be understood that when an element or a film layer is referred to as being "on" or "connected" to another element or film layer, it may be directly on or directly connected to the other element or film layer, or there is an intervening element or film layer there between (indirect connection). On the contrary, when an element is referred to as being "directly" on or "directly connected" to another element or film layer, there is no intervening element or film layer there between.

Although the terms first, second, third . . . may be used to describe various constituent elements, the constituent elements are not limited to these terms. These terms are only used to distinguish a single constituent element from other constituent elements in the specification. The same terms may not be used in the claims, which may be replaced by first, second, third . . . according to a declared order of the elements in the claims. Therefore, in the following description, the first constituent element may be the second constituent element in the claims.

In some embodiments of the disclosure, terms related to bonding and connecting, such as "connect", "interconnect", etc., unless specifically defined, may refer to direct contact of two structures, or refer to indirect contact of the two structures, and there are other structures provided between the two structures. The terms related to bonding and connecting may also include a situation that both structures are movable or both structures are fixed. In addition, the term "couple" includes any direct and indirect electrical connection means.

In the disclosure, a length and width may be measured by using an optical microscope, and a thickness may be obtained by measuring a cross-sectional image in an electron microscope, but the disclosure is not limited thereto. In addition, there may be a certain error in any two values or directions used for comparison.

The electronic device of the disclosure may include a display device, an antenna device, a sensing device, a touch display, a curved display, or a free shape display, but the disclosure is not limited thereto. The electronic device may be a bendable or flexible electronic device. The electronic device may include, for example, light-emitting diode, liquid crystal, fluorescence, phosphor, quantum dots (QD), other suitable display media, or a combination thereof, but the disclosure is not limited thereto. The light-emitting diode may, for example, include an organic light emitting diode (OLED), an inorganic light-emitting diode (LED), sub-millimeter light-emitting diode (mini LED), a micro light-emitting diode (micro LED), or a quantum dot light-emitting diode (for example, QLED, QDLED), or other suitable materials or any combination of the above LEDs, but the disclosure is not limited thereto. The display device may include, for example, a splicing display device, but the disclosure is not limited thereto. The antenna device may be, for example, a liquid crystal antenna, but the disclosure is not limited thereto. The antenna device may include, for example, an antenna splicing device, but the disclosure is not limited thereto. It should be noted that the electronic device may be any combination of the above devices, but the disclosure is not limited thereto. In addition, an appearance of the electronic device may be rectangular, circular, polygonal, a shape with curved edges, or other suitable shapes. The electronic device may have a peripheral system such as a driving system, a control system, a light source system, a shelving system, etc., to support the display device, the antenna device, or the splicing device. Hereinafter, an electronic device is used to illustrate the content of the disclosure, but the disclosure is not limited thereto.

It should be understood that in the following embodiments, features in several different embodiments may be substituted, reorganized, and mixed to complete other embodiments without departing from the spirit of the disclosure. As long as the features of the embodiments do not violate or conflict with the spirit of the disclosure, the features may be mixed and matched arbitrarily.

Reference will now be made in detail to the present preferred embodiments of the disclosure, examples of which are illustrated in the accompanying drawings. Wherever possible, the same reference numbers are used in the drawings and the description to refer to the same or like parts.

Figure 1B:
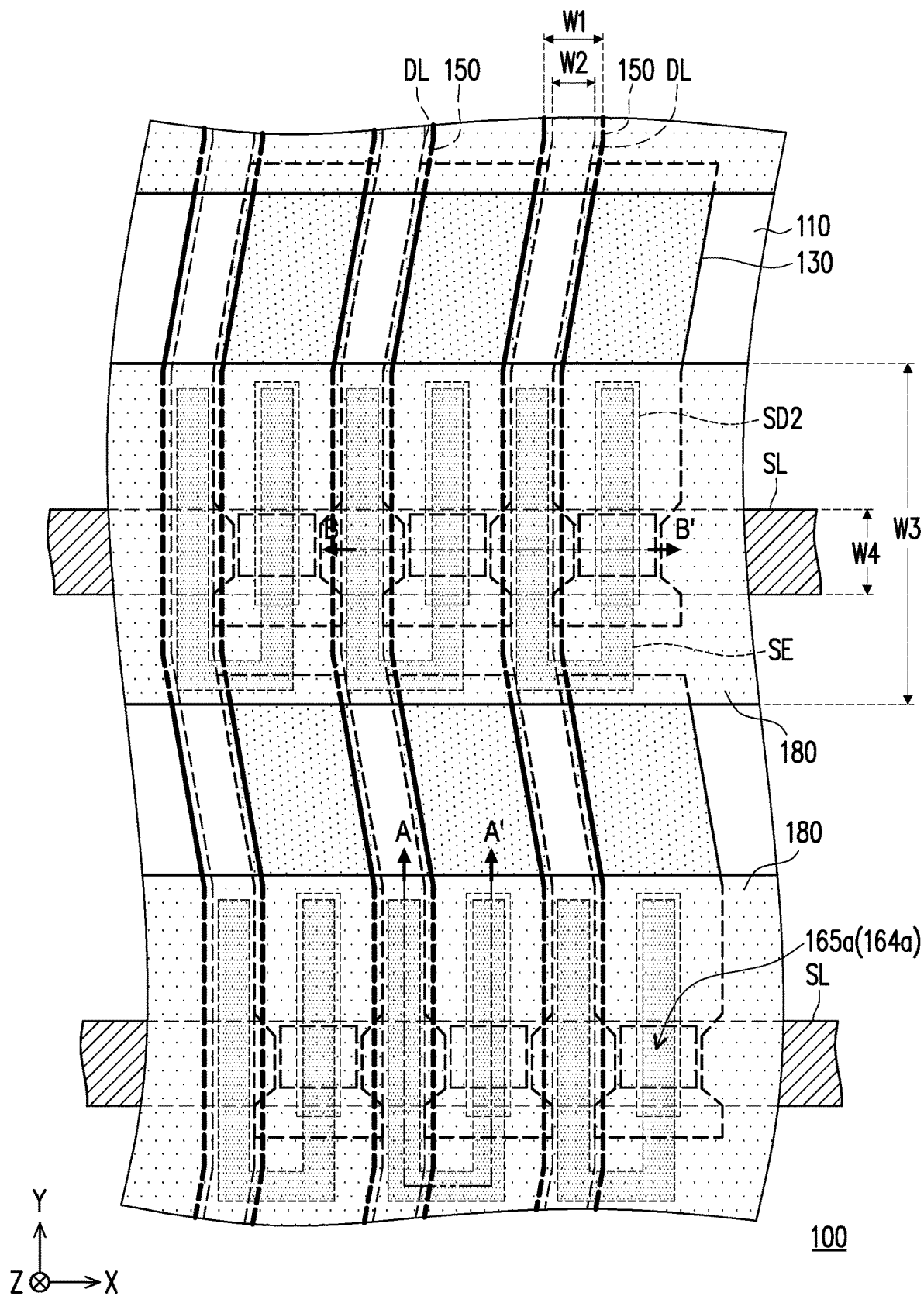
FIG. 1B is a schematic enlarged view of a region AA of FIG. 1A.
Figure 1C:
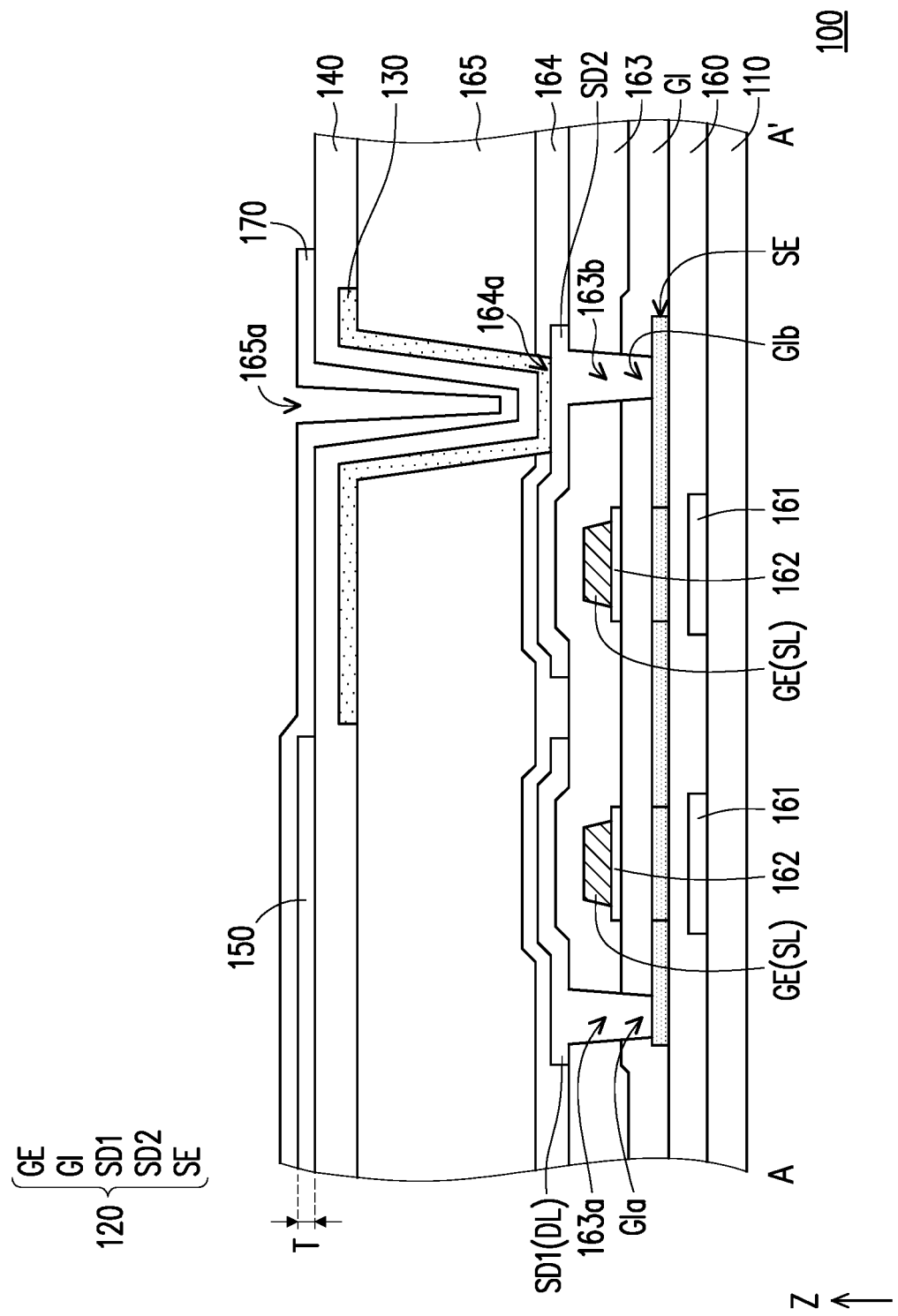
FIG. 1C is a schematic cross-sectional view of the electronic device of FIG. 1B along a section line A-A'.
Figure 1D:
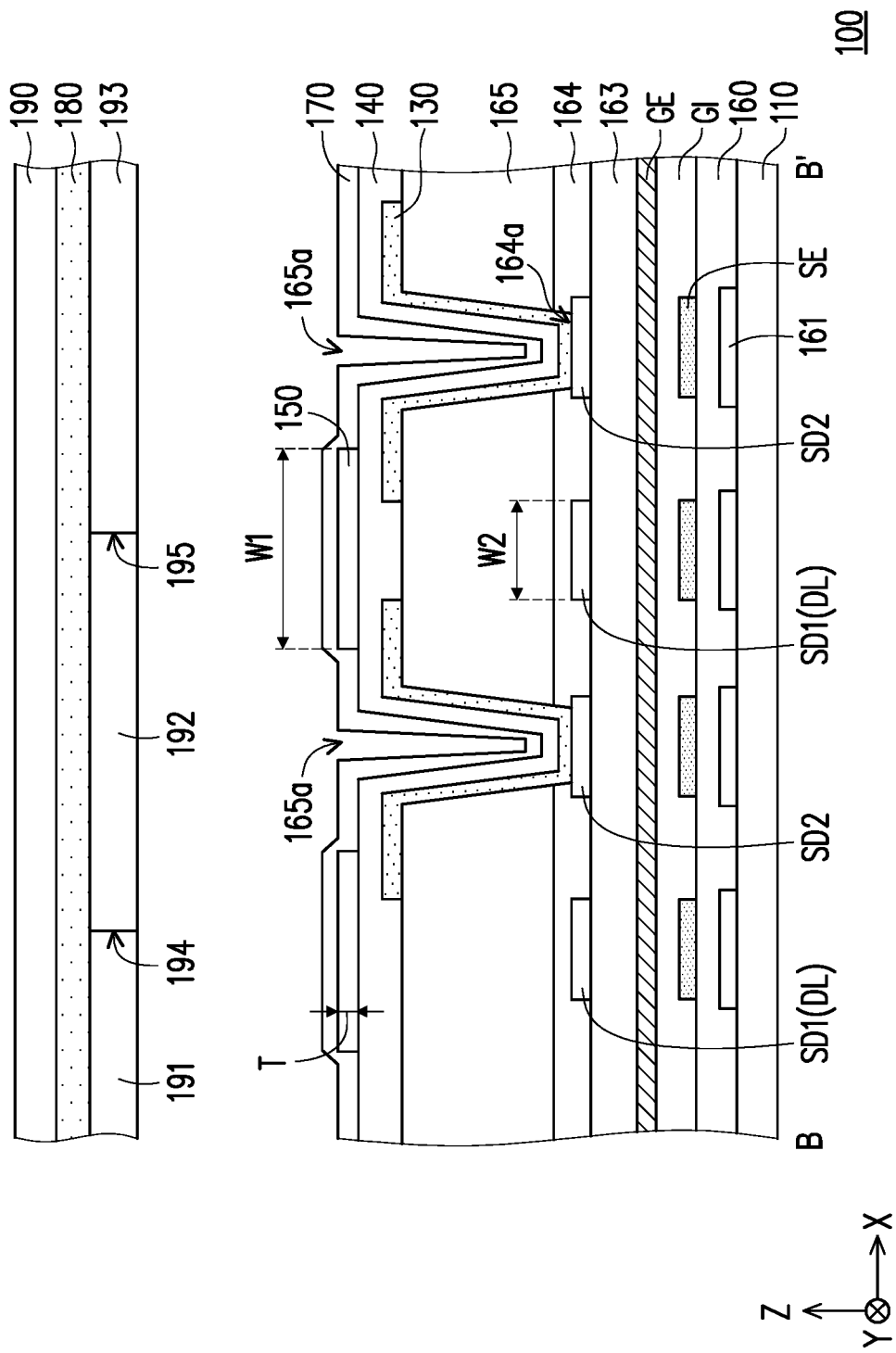
FIG. 1D is a schematic cross-sectional view of the electronic device of FIG. 1B along a section line B-B'.
Figure 1E:
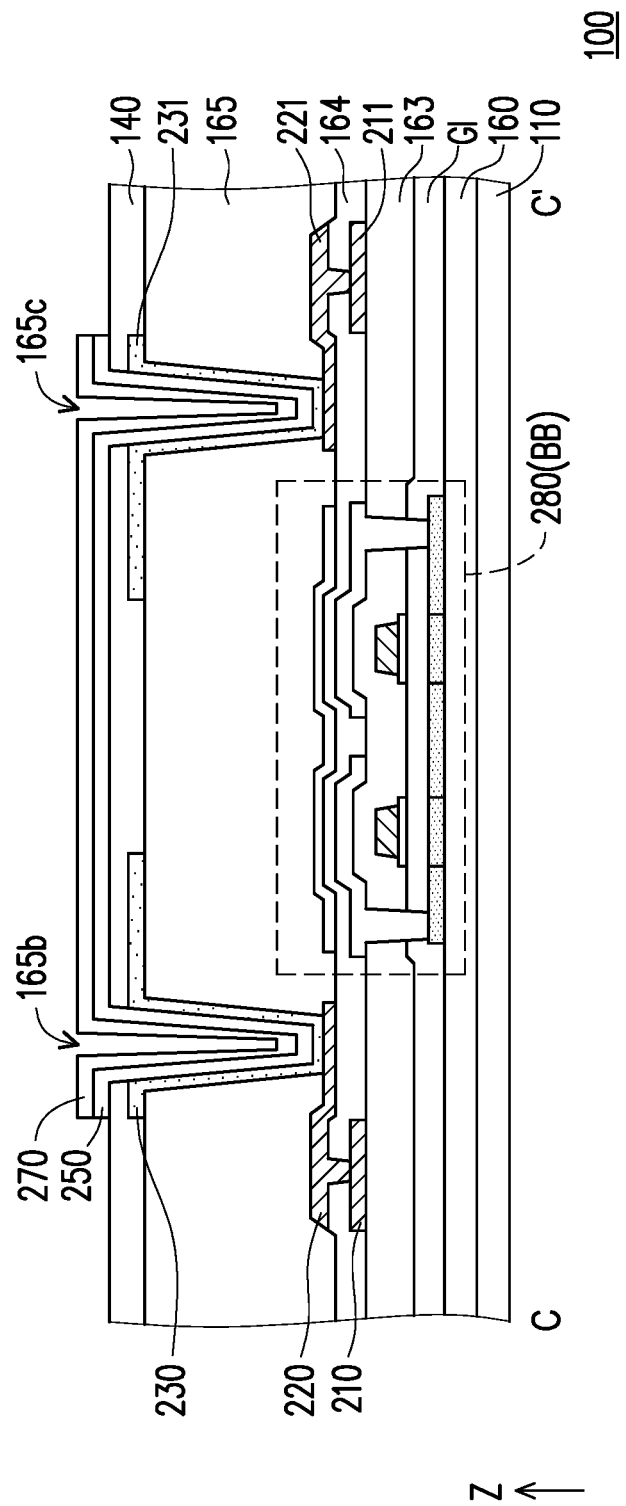
FIG. 1E is a schematic cross-sectional view of the electronic device of FIG. 1A along a section line C-C'.

FIG. 1A is a schematic top view of an electronic device according to an embodiment of the disclosure. FIG. 1B is a schematic enlarged view of a region AA of FIG. 1A. FIG. 1C is a schematic cross-sectional view of the electronic device of FIG. 1B along a section line A-A'. FIG. 1D is a schematic cross-sectional view of the electronic device of FIG. 1B along a section line B-B'. FIG. 1E is a schematic cross-sectional view of the electronic device of FIG. 1A along a section line C-C'. For clarity of the drawings and convenience of description, FIG. 1A and FIG. 1B omit several elements in the electronic device.

Referring to FIG. 1A to FIG. 1E at the same time, the electronic device 100 of the embodiment may be divided into a display area 101 and a non-display area 102, and the electronic device 100 includes a substrate 110, a transistor 120, a data line DL, a first transparent conductive layer 130, an insulating layer 140, and a metal layer 150. Where, the substrate 110 may include a rigid substrate, a flexible substrate, or a combination of the above substrates. For example, a material of the substrate 110 may include glass, quartz, sapphire, ceramics, polycarbonate (PC), polyimide (PI), polyethylene terephthalate (PET), other suitable substrate materials, or a combination thereof, but the disclosure is not limited thereto.

In the embodiment, the transistor 120 is disposed on the substrate 110. The transistor 120 includes a gate GE, a part of a gate insulating layer GI, a source SD1, a drain SD2, and a semiconductor layer SE, but the disclosure is not limited thereto. The gate insulating layer GI may have openings GIa and GIb to expose a part of the semiconductor layer SE. In the embodiment, a material of the source SD1 and/or the drain SD2 may include a transparent conductive material or a non-transparent conductive material, such as indium tin oxide, indium zinc oxide, indium oxide, zinc oxide, tin oxide, a metal material (such as aluminum, molybdenum, copper, silver, etc.), other suitable materials or a combination thereof, but the disclosure is not limited thereto. A material of the semiconductor layer SE may include amorphous silicon, low temperature polysilicon (LTPS), metal oxide (for example, indium gallium zinc oxide (IGZO)), other suitable materials, or a combination thereof, but the disclosure is not limited thereto. In some embodiments, the structure of the transistor 120 is not limited thereto, which may also be, for example, a bottom-gate type transistor, or may be changed to a double-gate transistor or other suitable transistors as required. In the embodiment, the electronic device 100 further includes a scan line SL. The scan line SL extends along a direction X, and the data line DL extends along a direction Y. A normal direction of the substrate 110 is a direction Z. The direction X, the direction Y, and the direction Z are different from each other, and the direction X, the direction Y, and the direction Z are perpendicular to each other. The scan line SL is disposed on the substrate 110 and electrically connected to the transistor 120, and the data line DL is disposed on the substrate 110 and electrically connected to the transistor 120. In detail, the scan line SL is electrically connected to the transistor 120 through the gate GE, and the data line DL is electrically connected to the transistor 120 through the source SD1.

In the embodiment, the electronic device 100 further includes a buffer layer 160, a shielding layer 161, an insulating layer 162, a dielectric layer 163, an insulating layer 164, an insulating layer 165, a second transparent conductive layer 170, a black matrix layer 180, another substrate 190 and a plurality of color filter layers 191, 192, and 193. Among them, the insulating layer 140, the buffer layer 160, the insulating layer 162, the dielectric layer 163, the insulating layer 164, and the insulating layer 165 may be single-layer or multi-layer structures, and may include, for example, an organic material, an inorganic material, or a combination thereof, but the disclosure is not limited thereto. In the embodiment, a material of the shielding layer 161 may be, for example, a metal material or other light shielding materials. In some embodiments, the electronic device 100 may not be provided with a shielding layer (not shown).

In the embodiment, the buffer layer 160 and the shielding layer 161 are both disposed between the transistor 120 and the substrate 110, and the shielding layer 161 is disposed corresponding to the gate GE. The insulating layer 162 is disposed between the gate GE and the gate insulating layer GI, and the insulating layer 162 is disposed corresponding to the gate GE. The dielectric layer 163 is disposed between the source SD1 (or the drain SD2) and the gate insulating layer GI to cover the gate GE and the gate insulating layer GI. The dielectric layer 163 may have openings 163a, 163b. Where, the opening 163a is interconnected with an opening GIa to expose a part of the semiconductor layer SE, and the opening 163b is interconnected with an opening GIb to expose a part of the semiconductor layer SE.

In the embodiment, the source SD1 and the drain SD2 are respectively disposed on the dielectric layer 163. The source SD1 may also be disposed in the opening 163a of the dielectric layer 163 and the opening GIa of the gate insulating layer GI, so that the source SD1 may be electrically connected to the semiconductor layer SE through the opening 163a and the opening GIA. The drain SD2 may also be disposed in the opening 163b of the dielectric layer 163 and the opening GIb of the gate insulating layer GI, so that the drain SD2 may be electrically connected to the semiconductor layer SE through the opening 163b and the opening GIb.

In the embodiment, the insulating layer 164 is disposed on the transistor 120. The insulating layer 164 covers the source SD1, the drain SD2 and the dielectric layer 163. The insulating layer 164 and the substrate 110 are respectively disposed on two opposite sides of the transistor 120. The insulating layer 164 has an opening 164a to expose a part of the drain SD2.

In the embodiment, the insulating layer 165 is disposed on the insulating layer 164. The insulating layer 165 and the transistor 120 are respectively disposed on two opposite sides of the insulating layer 164. The insulating layer 165 has an opening 165a. Where, the opening 165a is interconnected with the opening 164a to expose a part of the drain SD2.

In the embodiment, the first transparent conductive layer 130 is disposed on the data line DL, and the first transparent conductive layer 130 may be, for example, a pixel electrode or a common electrode, but the disclosure is not limited thereto. For example, in the embodiment, when the first transparent conductive layer 130 is a pixel electrode, the first transparent conductive layer 130 is disposed on the insulating layer 165 and located between the insulating layer 140 and the insulating layer 165. The first transparent conductive layer 130 may also be disposed in the opening 165a and the opening 164a, so that the first transparent conductive layer 130 may be electrically connected to the drain SD2 of the transistor 120 through the opening 165a of the insulating layer 165 and the opening 164a of the insulating layer 164.

In the embodiment, the insulating layer 140 is disposed on the first transparent conductive layer 130 and in the opening 165a. The insulating layer 140 covers the first transparent conductive layer 130 and the insulating layer 165.

In the embodiment, the second transparent conductive layer 170 is disposed on the insulating layer 140, and the second transparent conductive layer 170 may be, for example, a pixel electrode or a common electrode, but the disclosure is not limited thereto. For example, in the embodiment, when the second transparent conductive layer 170 is a common electrode, the second transparent conductive layer 170 may also be disposed in the opening 165a, so that the insulating layer 140 is located between the second transparent conductive layer 170 and the first transparent conductive layer 130. In the embodiment, a material of the second transparent conductive layer 170 may include, for example, a transparent conductive material, but the disclosure it is not limited thereto.

In the embodiment, the metal layer 150 is, for example, disposed on the insulating layer 140 of the substrate 110, so that the metal layer 150 is located between the second transparent conductive layer 170 and the first transparent conductive layer 130, but the disclosure is not limited thereto. In the embodiment, since the metal layer 150 may directly contact the second transparent conductive layer 170, the metal layer 150 may be electrically connected to the second transparent conductive layer 170, thereby reducing an impedance of the second transparent conductive layer 170, and improving signal uniformity. Moreover, in the embodiment, as measured in the normal direction (i.e., the direction Z) of the substrate 110, a thickness T of the metal layer 150 is, for example, less than 2000 angstroms (Å), so as to achieve an effect of shielding 99% of light penetration, but the disclosure is not limited thereto. In some embodiments, if there are other electrical considerations (for example, to serve as a trace), the thickness of the metal layer 150 may also be less than 5000 Å to achieve better electrical transfer characteristics.

In addition, in the top view (as shown in FIG. 1B) of the electronic device 100, since the metal layer 150 is disposed on the data line DL (or the source SD1) and is overlapped with the data line DL, when a material of the metal layer 150 is a low-reflective metal material, the metal layer 150 may be used to shield metal reflection of the data line DL (or the source SD1) to mitigate a problem in visual visibility caused by the metal reflection. In the embodiment, the material of the metal layer 150 may include a low-reflective metal material or a non-low-reflective metal material, but the disclosure is not limited thereto. For example, the low-reflective metal material may include molybdenum, titanium, chromium, the above-mentioned oxides, the above-mentioned nitrides, other suitable materials, or a combination thereof, but the disclosure is not limited thereto. The low-reflective metal material may include silver, aluminum, gold, copper, the above-mentioned oxides, the above-mentioned nitrides, other suitable materials, or a combination thereof, but the disclosure is not limited thereto. In the embodiment, the metal layer 150 may be a single-layer metal structure or a multilayer film stacked metal structure.

In the embodiment, in the top view of the electronic device 100 (as shown in FIG. 1B), as measured in an extending direction of the scan line SL (i.e., the direction X), a width W1 of the metal layer 150 is, for example, greater than a width W2 of the data line DL to shield the data line DL. In some embodiments, the width W1 of the metal layer 150 is, for example, less than 3 μm, but the disclosure is not limited thereto. Moreover, in the embodiment, since the metal layer 150 is disposed on the data line DL (or the source SD1), the width W1 of the metal layer 150 is greater than the width W2 of the data line DL, and the material of the metal layer 150 is the low-reflective metal material, the metal layer 150 may be used to replace an existing black matrix layer to shield the data line DL (or the source SD1). Namely, by configuring the metal layer 150, there is no need to additionally provide a black matrix layer for shielding the data line DL (or the source SD1), thereby avoiding a problem of residual and rounded corners of the existing black matrix layer caused during configuration thereof as the existing black matrix layer is required to simultaneously shield the data line DL and the scan line SL, and avoiding a problem of loss of an aperture ratio. In addition, since a line width of the existing black matrix layer cannot be as thin as possible (for example, to be less than 3 μm), when the metal layer 150 with the width W1 of less than 3 μm is used to replace the existing black matrix layer, an effect of increasing the aperture ratio is achieved.

Figure 2:
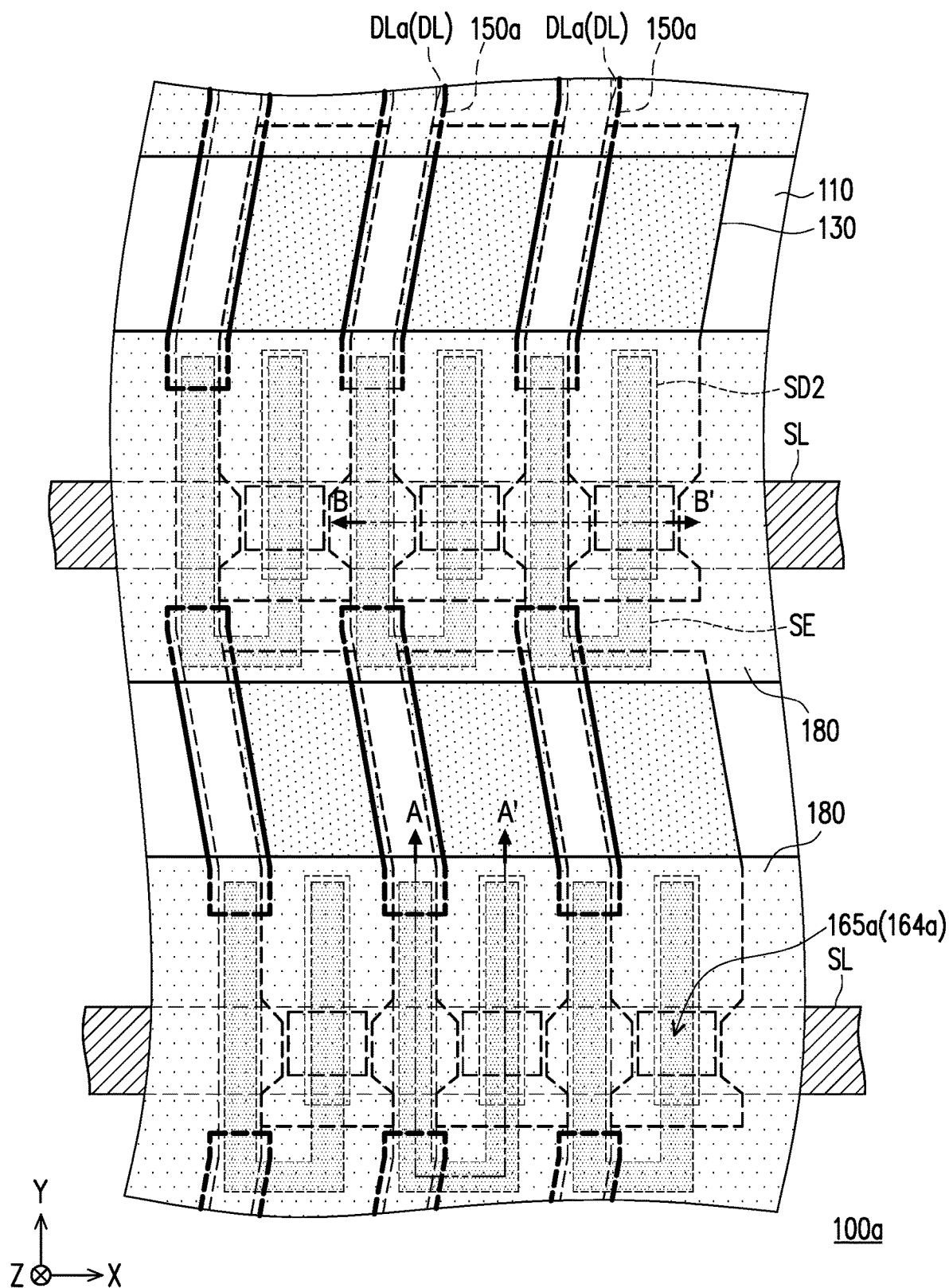
FIG. 2 is a schematic top view of an electronic device according to another embodiment of the disclosure.

In the embodiment, in the top view of the electronic device 100 (as shown in FIG. 1B), the metal layer 150 may be, for example, overlapped the entire data line DL, but the disclosure is not limited thereto. In some embodiments, the metal layer 150 may also be overlapped with a part of the data line DL, as shown in FIG. 2.

In the embodiment, although the first transparent conductive layer 130 is taken as the pixel electrode and the second transparent conductive layer 170 is taken as the common electrode, so that the metal layer 150 may directly contact the common electrode without contacting the pixel electrode, in other words, the metal layer 150 may directly contact the second transparent conductive layer 170 without contacting the first transparent conductive layer 130, or the metal layer 150 may directly contact the pixel electrode without contacting the common electrode, in other words, the metal layer 150 may directly contact the first transparent conductive layer 130 without contacting the second transparent conductive layer 170, the disclosure is not limited thereto, where when the metal layer 150 directly contacts the first transparent conductive layer 130, a probability of light entering the semiconductor layer SE of the transistor is reduced. In some embodiments, the first transparent conductive layer may also be a common electrode and the second transparent conductive layer is a pixel electrode (not shown). Therefore, when the first transparent conductive layer 130 is the common electrode and the second transparent conductive layer 170 is the pixel electrode, the metal layer 150 may also directly contact the common electrode without contacting the pixel electrode, in other words, the metal layer 150 may directly contact the first transparent conductive layer 130 without contacting the second transparent conductive layer 170 (not shown), where when the metal layer 150 directly contacts the first transparent conductive layer 130, the probability of light entering the semiconductor layer SE of the transistor is reduced, or the metal layer 150 may directly contact the pixel electrode without contacting the common electrode, in other words, the metal layer 150 may directly contact the second transparent conductive layer 170 without contacting the first transparent conductive layer 130, but the disclosure is not limited thereto.

Figure 4:
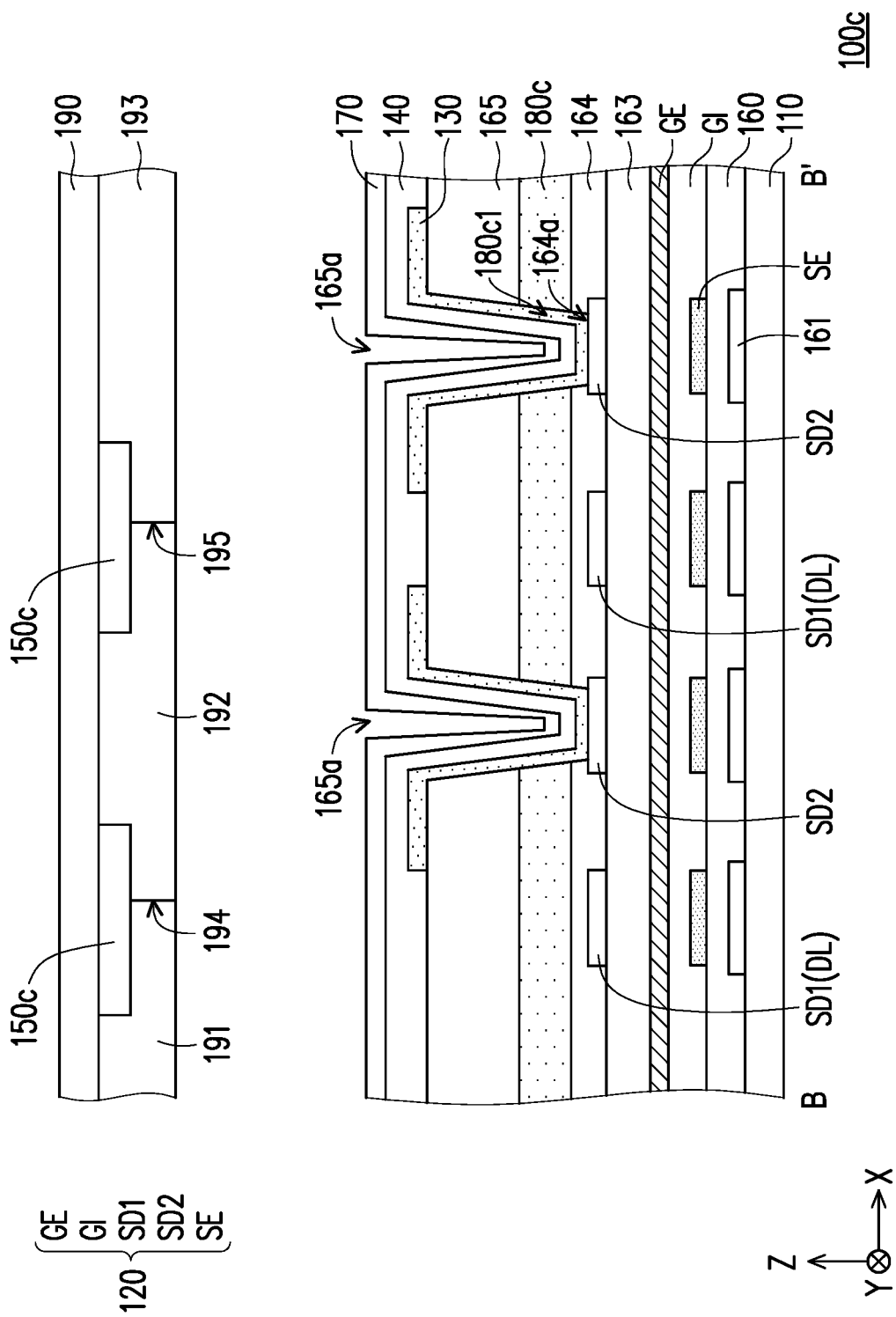
FIG. 4 is a schematic cross-sectional view of an electronic device according to another embodiment of the disclosure.
Figure 5:
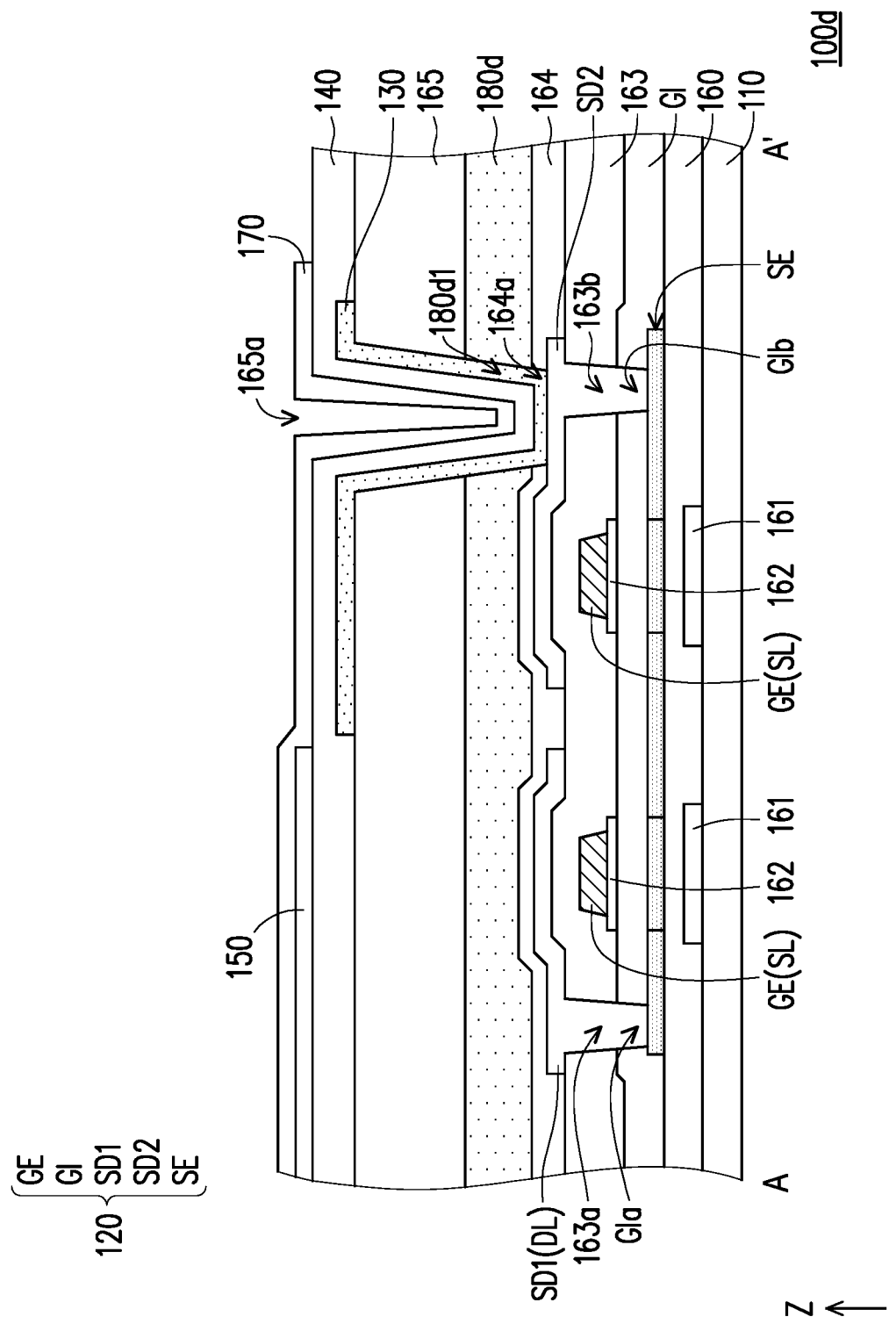
FIG. 5 is a schematic cross-sectional view of an electronic device according to another embodiment of the disclosure.

In the embodiment, the black matrix layer 180 is disposed on the scan line SL and is overlapped with the entire scan line SL. In detail, the black matrix layer 180 and the metal layer 150 are different layers. The black matrix layer 180 is, for example, disposed on the other substrate 190 and located between the other substrate 190 and the color filter layers 191, 192, and 193, but the disclosure is not limited thereto. In some embodiments, the black matrix layer 180 may also be disposed on the substrate 110 and be a different layer from the metal layer 150, as shown in FIG. 4 and FIG. 5. In addition, in this embodiment, as measured in the extending direction of the data line DL (i.e., the direction Y), a width W3 of the black matrix layer 180 is, for example, greater than a width W4 of the scan line SL, so as to shield the scan line SL.

In the embodiment, the color filter layers 191, 192, and 193 are disposed on the other substrate 190. The color filter layers 191, 192, and 193 may be, for example, respectively a blue filter layer, a red filter layer, and a green filter layer, but the disclosure is not limited thereto. Where, a boundary 194 between the color filter layer 191 and the color filter layer 192, a boundary 195 between the color filter layer 192 and the color filter layer 193, and a boundary (not shown) between the color filter layer 191 and the color filter layer 193 are parallel to the extending direction of the scan line SL (i.e., the direction X), and may be regarded as a mixed color or light color region. In the embodiment, since the metal layer 150 may be disposed corresponding to the boundaries 194, 195 between two adjacent color filter layers, the metal layer 150 may shield the mixed color or light color region to improve the contrast. For example, the metal layer 150 may be arranged corresponding to the boundary 194 between the adjacent color filter layer 191 and the color filter layer 192, and the metal layer 150 may also be arranged corresponding to the boundary 195 between the adjacent color filter layer 192 and the color filter layer 193.

In the embodiment, although the metal layer 150 is disposed on the substrate 110 and the black matrix layer 180 is disposed on the other substrate 190, the disclosure does not limit the positions of the metal layer 150 and the black matrix layer 180, as long as the metal layer 150 is disposed on the data line DL (or the source SD1) and the black matrix layer 180 is disposed on the scan line SL. Namely, in some embodiments, the metal layer may be disposed on the other substrate and the black matrix layer is disposed on the substrate, as shown in FIG. 4. In some embodiments, the metal layer and the black matrix layer may all be disposed on the substrate, as shown in FIG. 5. In some embodiments, the metal layer and the black matrix layer may all be disposed on the other substrate (not shown).

Referring to FIG. 1A and FIG. 1E, in the embodiment, the non-display area 102 may include a de-multiplexer circuits area 1021, an electrostatic discharge circuits area 1022, a fanout area 1023, and a driving chip area 1024. Where, a metal layer 250 may also be disposed in the de-multiplexer circuits area 1021, the electrostatic discharge circuits area 1022, and the fanout area 1023 in the non-display area 102, so as to transmit a signal of the driving chip area 1024 to the display area 101.

To be specific, referring to FIG. 1E, in the embodiment, the electronic device 100 further includes a metal pad 210, a metal pad 211, a transfer pad 220, a transfer pad 221, a first transparent conductive layer 230, a first transparent conductive layer 231, a metal layer 250, and a second transparent conductive layer 270. A region BB may be regarded as an enlarged schematic view of the de-multiplexer circuits area 1021, the electrostatic discharge circuits area 1022, and the fanout area 1023, and a transistor 280 is schematically illustrated, but the disclosure is not limited thereto. Where, the metal pad 210 and the metal pad 211 are disposed on the dielectric layer 163, and are the same layer as the source SD1 (or the drain SD2). The transfer pad 220 and the transfer pad 221 are disposed on the insulating layer 164 and are electrically connected to the metal pad 210 and the metal pad 211, respectively. The first transparent conductive layer 230 and the first transparent conductive layer 231 are disposed on the insulating layer 165. The first transparent conductive layer 230 and the first transparent conductive layer 231 are respectively disposed in an opening 165b and an opening 165c of the insulating layer 165, so that the first transparent conductive layer 230 and the first transparent conductive layer 231 may be electrically connected to the transfer pad 220 and the transfer pad 221, respectively. The metal layer 250 is disposed on the insulating layer 140 and also disposed in the opening 165b and the opening 165c of the insulating layer 165, so that the metal layer 250 may be electrically connected to the first transparent conductive layer 230 and the first transparent conductive layer 231. The second transparent conductive layer 270 is disposed on the metal layer 250 and may directly contact the metal layer 250 for electrical connection.

Therefore, when the metal pad 211 receives a signal from the driving chip area 1024, the signal may be transmitted to the display area 101 through the transfer pad 221, the first transparent conductive layer 231, the metal layer 250, the transparent conductive layer 230, the transfer pad 220, and the metal pad 210. Therefore, in the embodiment, the metal layer 250 disposed in the non-display area 102 may be a transfer layer structure to transmit the signal of the driving chip area 1024 to the display area 101, thereby reducing a loading of signal transmission of the second transparent conductive layer 270.

In the embodiment, although the above-mentioned region BB may be regarded as an enlarged schematic view of the de-multiplexer circuits area 1021, the electrostatic discharge circuits area 1022, and the fanout area 1023, the disclosure is not limited thereto. In other words, in some embodiments, the region BB may also be regarded as an enlarged schematic view of the de-multiplexer circuits area 1021 and the electrostatic discharge circuits area 1022. In some embodiments, the region BB may also be regarded as an enlarged schematic view of the de-multiplexer circuits area 1021.

In the electronic device 100 of the embodiment of the disclosure, the metal layer 150 is disposed on the data line DL and the metal layer 150 is overlapped with the data line DL, so that the metal layer 150 may be used to shield the data line DL and mitigate a problem of visual visibility caused by metal reflection of the data line DL. Then, since the metal layer 150 may be used to replace the existing black matrix layer to shield the data line DL, the problem of residual and rounded corners of the existing black matrix layer caused during configuration thereof is avoided, and the problem of loss of the aperture ratio is avoided. In addition, since the width W1 of the metal layer 150 may be smaller than a line width of the black matrix layer, to use the metal layer 150 to replace the existing black matrix layer also has the effect of increasing the aperture ratio. In addition, by electrically connecting the metal layer 150 with the second transparent conductive layer 170, the impedance of the second transparent conductive layer 170 may be reduced, which has the effect of improving signal uniformity. Moreover, by disposing the metal layer 250 in the non-display area 102 of the electronic device 100 and making the metal layer 250 to electrically connect the second transparent conductive layer 270, the metal layer 250 may be used as a transfer layer structure to reduce a loading of the second transparent conductive layer 270.

Other embodiments are provided below for further description. It should be noticed that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

FIG. 2 is a schematic top view of an electronic device according to another embodiment of the disclosure. Referring to FIG. 1B and FIG. 2, an electronic device 100a of the embodiment is substantially similar to the electronic device 100 of FIG. 1B, so that the same and similar components in the two embodiments are not repeated. In the top view of the electronic device 100a of the embodiment, a metal layer 150a is only overlapped with a part DLa of the data line DL. In detail, the metal layer 150a is at least overlapped with a part of the data line DL exposed by the black matrix layer 180, thereby shielding the metal reflection of the data line DL to reduce the problem of visual visibility caused by the metal reflection.

Figure 3:
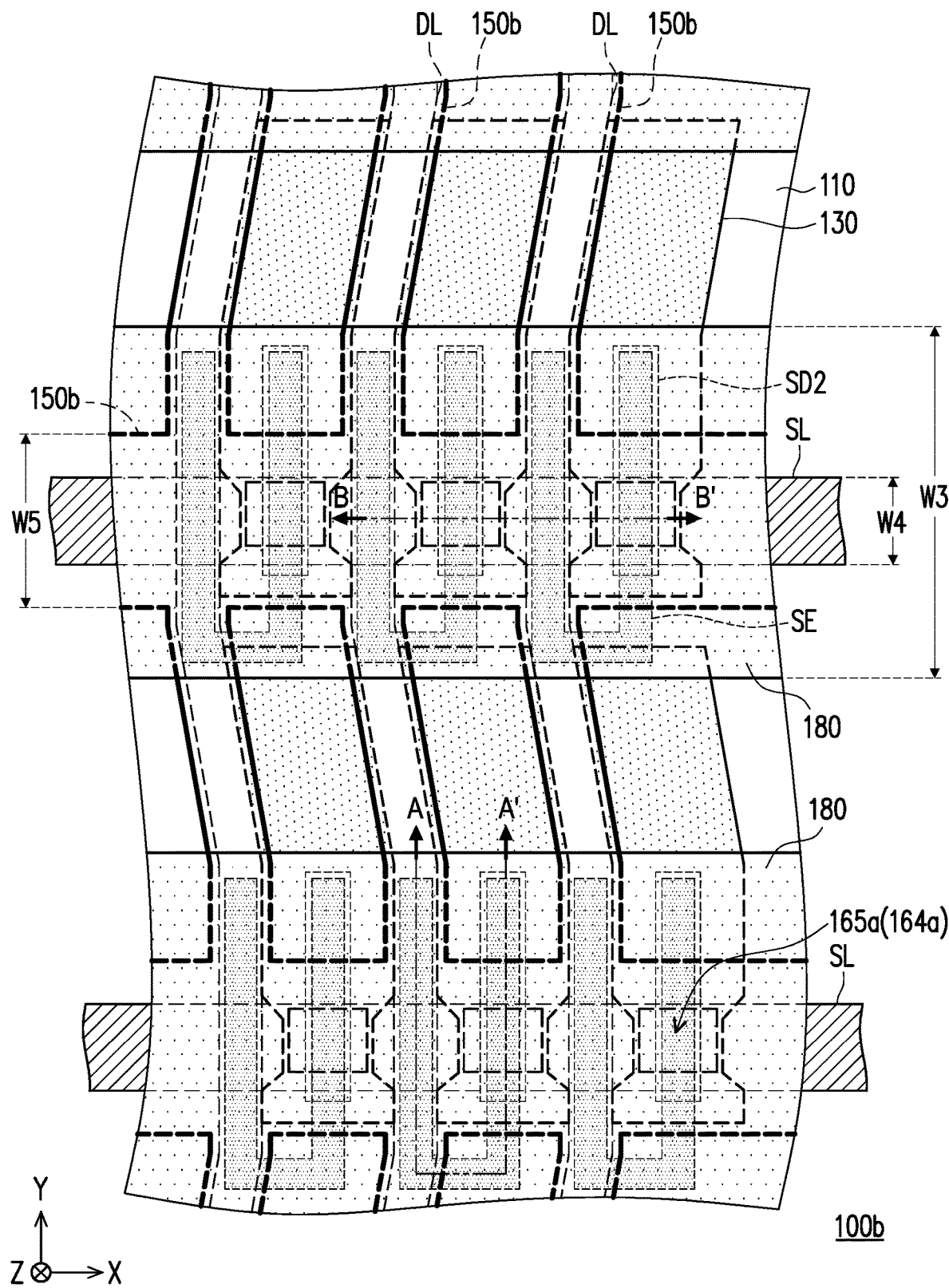
FIG. 3 is a schematic top view of an electronic device according to another embodiment of the disclosure.

FIG. 3 is a schematic top view of an electronic device according to another embodiment of the disclosure. Referring to FIG. 1B and FIG. 3, an electronic device 100b of the embodiment is substantially similar to the electronic device 100 of FIG. 1B, so that the same and similar components in the two embodiments are not repeated. In the top view of the electronic device 100b of the embodiment, a metal layer 150b may also be disposed on the scan line SL and the data line DL, so that the metal layer 150b may also be overlapped with the scan line SL and the data line DL. Namely, in the top view of the electronic device 100b of the embodiment, the metal layer 150b has a grid-like structure to overlap and shield the data line DL and the scan line SL. Moreover, as measured in the extending direction of the data line DL (i.e., the direction Y), another width W5 of the metal layer 150b is greater than the width W4 of the scan line SL, and the width W3 of the black matrix layer 180 is greater than the other width W5 of the metal layer 150b.

FIG. 4 is a schematic cross-sectional view of an electronic device according to another embodiment of the disclosure. Referring to FIG. 1D and FIG. 4, an electronic device 100c of the embodiment is substantially similar to the electronic device 100 of FIG. 1D, so that the same and similar components in the two embodiments are not repeated. In the electronic device 100c of the embodiment, a metal layer 150c is disposed on another substrate 190, and a black matrix layer 180c is disposed on the substrate 110.

In detail, in the embodiment, the metal layer 150c is disposed on the source SD1 (or the data line DL), and is disposed between the other substrate 190 and the color filter layers 191, 192, and 193. The metal layer 150c may be arranged corresponding to the boundary 194 between the adjacent color filter layer 191 and the color filter layer 192, and the metal layer 150c may also be arranged corresponding to the boundary 195 between the adjacent color filter layer 192 and the color filter layer 193.

In the embodiment, the black matrix layer 180c is disposed on the gate GE (or the scan line SL), and is disposed between the transistor 120 and the insulating layer 165. The black matrix layer 180c may have an opening 180c1. Where, the opening 180c1 is interconnected with the opening 164a of the insulating layer 164 to expose a part of the drain SD2. In addition, since the opening 165a of the insulating layer 165 may be interconnected with the opening 180c1 and the opening 164a, the first transparent conductive layer 130 may also be disposed in the opening 165a, the opening 180c1, and the opening 164a.

FIG. 5 is a schematic cross-sectional view of an electronic device according to another embodiment of the disclosure. Referring to FIG. 1C and FIG. 5, an electronic device 100d of the embodiment is substantially similar to the electronic device 100 of FIG. 1C, so that the same and similar components in the two embodiments are not repeated. In the electronic device 100d of the embodiment, a black matrix layer 180d is disposed on the substrate 110.

In detail, in the embodiment, the black matrix layer 180d is disposed on the gate GE (or the scan line SL), and is disposed between the transistor 120 and the insulating layer 165. The black matrix layer 180d may have an opening 180d1. Where, the opening 180d1 is interconnected with the opening 164a of the insulating layer 164 to expose a part of the drain SD2. In addition, since the opening 165a of the insulating layer 165 may be interconnected with the opening 180d1 and the opening 164a, the first transparent conductive layer 130 may also be disposed in the opening 165a, the opening 180d1, and the opening 164a.

In summary, in the electronic device of the embodiment of the disclosure, the metal layer is disposed on the data line and the metal layer is overlapped with the data line, so that the metal layer may be used to shield the data line to mitigate the problem of visual visibility caused by metal reflection of the data line. Then, since the metal layer may be used to replace the existing black matrix layer to shield the data line, the problem of residual and rounded corners of the existing black matrix layer caused during configuration thereof is avoided, and the problem of loss of the aperture ratio is avoided. In addition, since the line width of the metal layer may be smaller than a line width of the black matrix layer, to use the metal layer to replace the existing black matrix layer also has the effect of increasing the aperture ratio. In addition, by electrically connecting the metal layer with the transparent conductive layer, the impedance of the transparent conductive layer may be reduced, which has the effect of improving signal uniformity, and the probability of light entering the semiconductor layer of the transistor is reduced. Moreover, by disposing the metal layer in the non-display area of the electronic device and making the metal layer to electrically connect the transparent conductive layer, the metal layer may be used as a signal transfer layer to reduce a loading of the transparent conductive layer.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electronic device, comprising:
    a substrate;
    a data line disposed on the substrate;
    an insulating layer disposed on the data line;
    a metal layer disposed on the insulating layer; and
    a transparent conductive layer disposed on the metal layer and electrically connected to the metal layer,
    wherein the metal layer is disposed between the transparent conductive layer and the insulating layer.

2. The electronic device as claimed in claim 1, further comprising:
    a semiconductor layer disposed on the substrate and electrically connected to the data line.

3. The electronic device as claimed in claim 2, wherein a material of the semiconductor layer comprises amorphous silicon, low temperature polysilicon, metal oxide, or a combination thereof.

4. The electronic device as claimed in claim 1, further comprising:
    a scan line disposed on the substrate, wherein a part of the metal layer overlaps the scan line, and the part of the metal layer extends along an extension direction of the scan line.

5. The electronic device as claimed in claim 1, further comprising:
    a scan line disposed on the substrate, wherein as measured in an extending direction of the data line, a width of the metal layer is greater than a width of the scan line.

6. The electronic device as claimed in claim 1, further comprising:
    a scan line disposed on the substrate, wherein as measured in an extending direction of the scan line, another width of the metal layer is greater than a width of the data line.

7. The electronic device as claimed in claim 1, wherein a material of the metal layer comprises molybdenum, titanium, chromium or oxides thereof.

8. The electronic device as claimed in claim 1, further comprising:
    a scan line disposed on the substrate,
    wherein the data line comprises a first portion and a second portion are respectively disposed on opposite sides of the scan line, the first portion extends in a first direction, the second portion extends in a second direction, and the first direction is different from the second direction.

9. The electronic device as claimed in claim 1, further comprising:
    two adjacent scan lines disposed on the substrate, wherein a part of the data line between the two adjacent scan lines has a turning portion.

10. The electronic device as claimed in claim 1, further comprising:
    a scan line disposed on the substrate and intersected with the data line, wherein the insulating layer has an opening, and at least a part of the transparent conductive layer is disposed in the opening.

11. The electronic device as claimed in claim 10, wherein the opening is overlapped with the scan line.

12. The electronic device as claimed in claim 1, further comprising:
    another substrate disposed opposite to the substrate; and
    a plurality of color filter layers disposed on the another substrate, wherein the metal layer is disposed corresponding to a boundary between two adjacent ones of the color filter layers.

13. The electronic device as claimed in claim 1, further comprising:
    a display area; and
    a non-display area adjacent to the display area, wherein the metal layer is disposed in the display area and the non-display area.

14. The electronic device as claimed in claim 13, wherein the non-display area comprises a de-multiplexer circuits area, an electrostatic discharge circuits area, and a fanout area.

* * * * *